(12) United States Patent
Hu et al.

(10) Patent No.: US 8,912,558 B2
(45) Date of Patent: Dec. 16, 2014

(54) LIGHT EMITTING DIODE PACKAGE

(71) Applicants: Pi-Chiang Hu, Hsinchu (TW);
Shih-Yuan Hsu, Hsinchu (TW)

(72) Inventors: Pi-Chiang Hu, Hsinchu (TW);
Shih-Yuan Hsu, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 14/201,982

(22) Filed: Mar. 10, 2014

(65) Prior Publication Data

US 2014/0183587 A1 Jul. 3, 2014

Related U.S. Application Data

(62) Division of application No. 13/476,038, filed on May 21, 2012, now Pat. No. 8,709,842.

(30) Foreign Application Priority Data

Jul. 27, 2011 (CN) .......................... 2011 1 02119064

(51) Int. Cl.
 *H01L 33/44* (2010.01)
 *H01L 33/50* (2010.01)
(52) U.S. Cl.
 CPC ............ *H01L 33/507* (2013.01); *H01L 33/505* (2013.01); *H01L 2933/0041* (2013.01)
 USPC .. 257/96; 438/27; 257/E33.056; 257/E33.061

(58) Field of Classification Search
 USPC ................................................ 257/96; 438/27
 See application file for complete search history.

(56) References Cited

U.S. PATENT DOCUMENTS

| 2002/0185966 | A1 | 12/2002 | Murano |
| 2004/0041220 | A1* | 3/2004 | Kwak et al. .................... 257/432 |
| 2009/0273004 | A1* | 11/2009 | Lin et al. .......................... 257/99 |
| 2010/0258830 | A1 | 10/2010 | Ide et al. |
| 2012/0001214 | A1* | 1/2012 | Ooyabu et al. ................... 257/98 |

FOREIGN PATENT DOCUMENTS

| CN | 102367017 A | 3/2012 |
| TW | M408131 U1 | 7/2011 |

\* cited by examiner

*Primary Examiner* — Marc Armand
(74) *Attorney, Agent, or Firm* — Novak Druce Connolly Bove + Quigg LLP (57) ABSTRACT

An LED package includes a substrate, an LED chip arranged on the substrate, and a light transmission layer arranged on a light output path of the LED chip. The substrate includes a first electrode and a second electrode separated and electrically insulated from the first electrode. The LED chip is electrically connected to the first electrode and the second electrode of the substrate. The light transmission layer comprises two parallel transparent plates and a fluorescent layer sandwiched between the two transparent plates. The LED package further includes an encapsulation layer sealing the LED chip therein. The light transmission layer is directly located on a top surface of each LED chip, and the encapsulation layer seals the light transmission layer therein.

10 Claims, 14 Drawing Sheets

LIGHT EMITTING DIODE PACKAGE

CROSS-REFERENCE TO RELATED APPLICATIONS

This patent application is a divisional application of patent application No. 13/476,038, filed on May 21, 2012, entitled "LIGHT-EMITTING DIODE PACKAGE AND METHOD FOR MANUFACTURING THE SAME", which is assigned to the same assignee as the present application, and which is based on and claims priority from Chinese Patent Application No. 201110211906.4, filed in China on Jul. 27, 2011. The disclosures of patent application No. 13/476,038, and the Chinese Patent Application are incorporated herein by reference in their entirety.

BACKGROUND

1. Technical Field

The present disclosure relates to a light emitting diode (LED) package.

2. Description of Related Art

LEDs have been widely promoted as a light source of electronic devices owing to many advantages, such as high luminosity, low operational voltage and low power consumption. In practice, the LED chip is generally packaged to protect the LED chip, and the fluorescent layer is formed on the LED chip by coating. However, during the coating of the packaging process, a thickness of the fluorescent layer cannot be controlled precisely, whereby a uniform light output cannot obtained, which unfavorably affects the quality of light generated by the LED package.

Therefore, an LED package capable of overcoming the above described shortcoming is desired.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiment of the present LED package and the method for making the LED package will now be described in detail below and with reference to the drawings.

Figure 1:
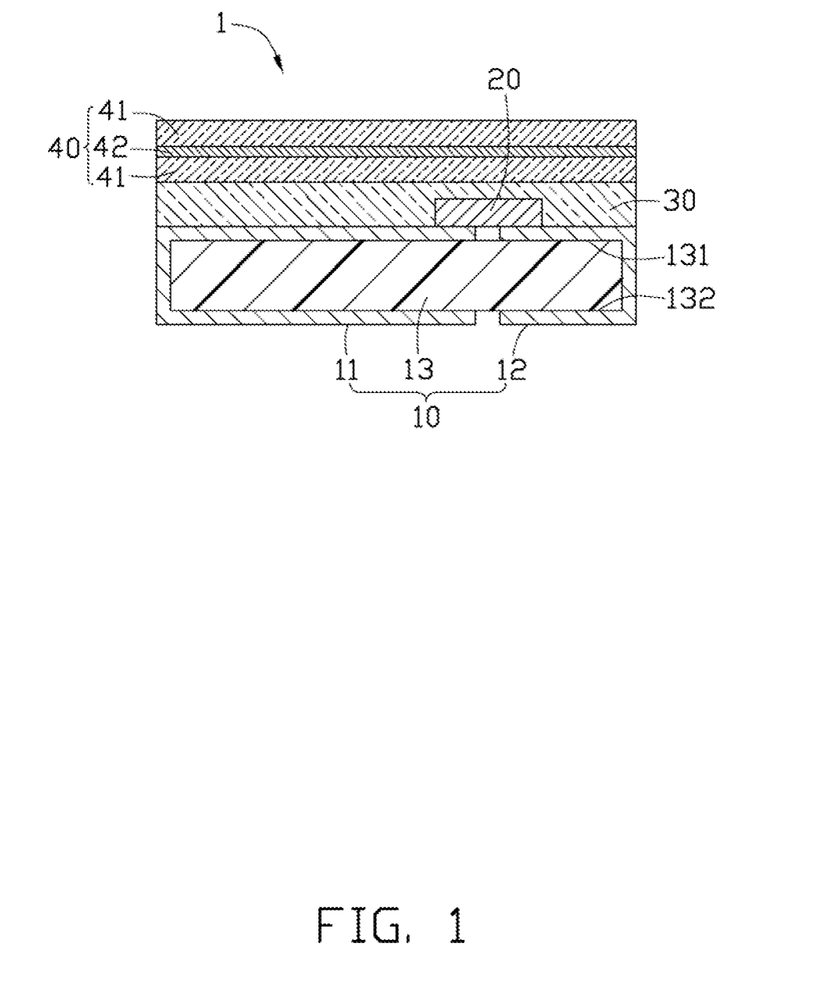
FIG. 1 is a schematic, cross-sectional view of an LED package in accordance with a first embodiment of the present disclosure.

Referring to FIG. 1, an LED package 1 in accordance with a first embodiment of the present disclosure includes a substrate 10, an LED chip 20, an encapsulation layer 30 and a light transmission layer 40.

The substrate 10 includes a plate 13, a first electrode 11 and a second electrode 12 separated and electrically insulated from the first electrode 11. The first electrode 11 and the second electrode 12 are located on opposite sides of the plate 13, respectively.

The plate 13 is made of an electrically insulated material with high heat conductivity, such as ceramic or silicon. In this embodiment, the plate 13 is flat, and includes a top surface 131 and a bottom surface 132 opposite to the top surface 131.

The first electrode 11 and the second electrode 12 each extend from the top surface 131 to the bottom surface 132 and traverse an outer periphery side surface of the plate 13. The first electrode 11 and the second electrode 12 are made of metallic material with high electrical conductivity, such as gold, silver, platinum, copper, aluminum, nickel, tin, magnesium or an alloy thereof.

The LED chip 20 is located on the substrate 10. In this embodiment, the LED chip 20 is electrically connected to the first electrode 11 and the second electrode 12 by flip-chip. Specifically, the LED chip 20 is located on the first electrode 11 and the second electrode 12, and directly contacts the first electrode 11 and the second electrode 12. Alternatively, the LED chip 20 can also be electrically connected to the first electrode 11 and the second electrode 12 by metal wires.

The encapsulation layer 30 is located on the substrate 10 and seals the LED chip 20 therein. In this embodiment, the encapsulation layer 30 is flat and transparent.

The light transmission layer 40 is arranged on a light output path of the LED chip 20. In this embodiment, the light transmission layer 40 is located on the encapsulation layer 30, and an outer periphery of the light transmission layer 40 is aligned with that of the encapsulation layer 30. The light transmission layer 40 includes two parallel transparent plates 41 and a fluorescent layer 42 sandwiched between the two transparent plates 41. A length of the transparent plate 41 is equal to that of the fluorescent layer 42, and a thickness of the transparent plate 41 is greater than that of the fluorescent layer 42. In this embodiment, the thickness of the fluorescent layer 42 is less than 100, um. The transparent plate 41 is a transparent ceramic plate. Alternatively, the transparent plate 41 can also be made of other hard and transparent material.

Because the light transmission layer 40 which is located on the LED chip 20 includes the two parallel transparent plates 41 and the fluorescent layer 42 sandwiched therebetween, and the thickness of the fluorescent layer 42 is kept uniform, the light emitting from the LED package 1 is uniform.

The LED package 1 described above can be manufactured in following steps.

Figure 2:
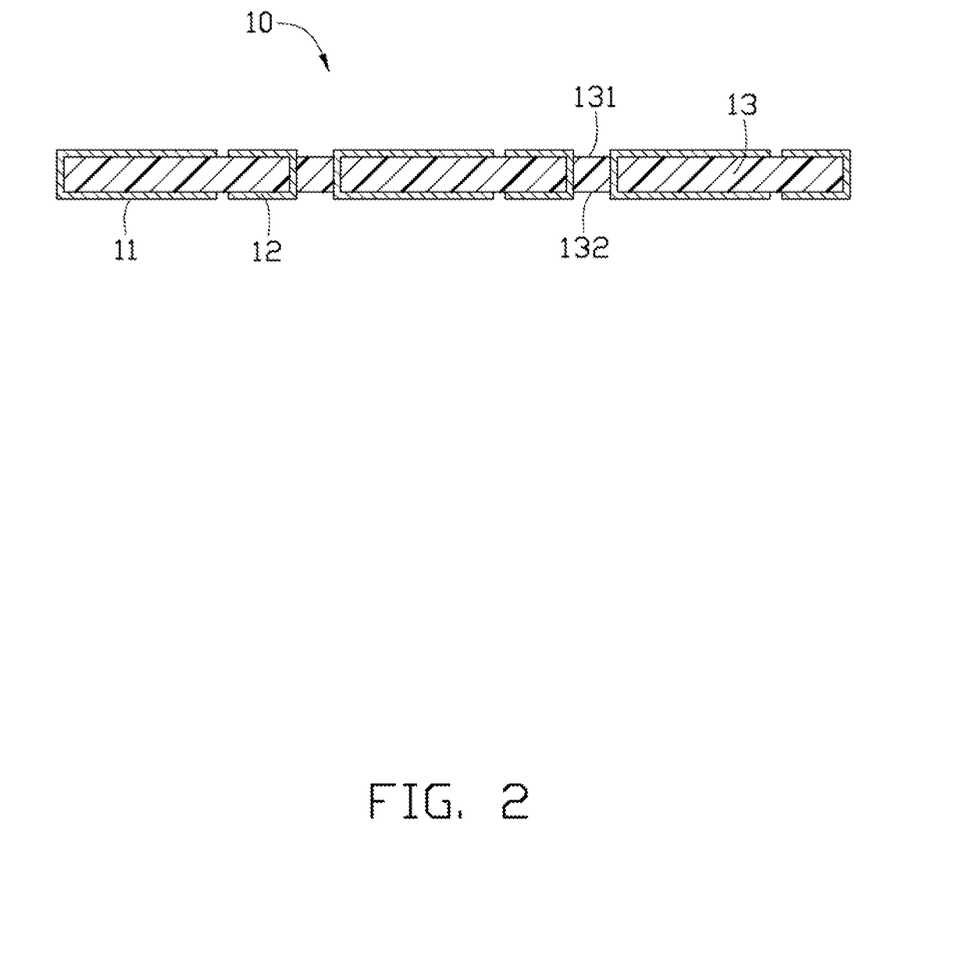
FIGS. 2-7 show steps of a method for manufacturing the LED package of FIG. 1.

As shown in FIG. 2, an elongated substrate 10 is provided. The substrate 10 includes a plate 13 and a number of pairs of first electrodes 11 and second electrodes 12. Each of the second electrodes 12 is separated and electrically insulated from the corresponding one of the first electrodes 11, and the pairs of first electrodes 11 and second electrodes 12 are equidistantly located at different regions of the plate 13. The plate 13 is made of an electrically insulated material with high heat conductivity, such as ceramic or silicon. In this embodiment, the plate 13 is flat, and includes a top surface 131 and a bottom surface 132 opposite to the top surface 131. Each of the first electrode 11 and the second electrode 12 respectively extends from the top surface 131 and traverses downwardly through the plate 13 to reach the bottom surface 132. The first electrode 11 and the second electrode 12 are made of metallic material with high electrical conductivity, such as gold, silver, platinum, copper, aluminum, nickel, tin, magnesium or an alloy thereof.

Figure 3:
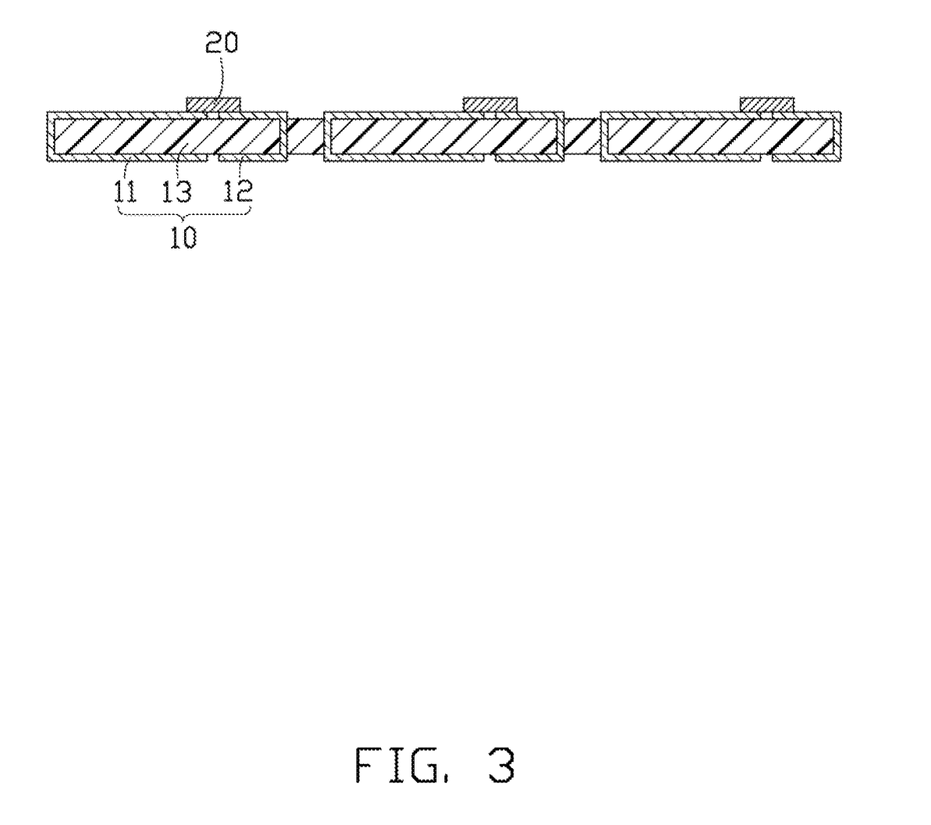

As shown in FIG. 3, a plurality of LED chips 20 are provided on the substrate 10. Each of the LED chips 20 is electrically connected to the corresponding first electrode 11 and the corresponding second electrode 12. In this embodiment, the LED chips 20 are located over the plate 13, and each LED chip 40 is electrically connected to the corresponding first electrode 11 and the corresponding second electrode 12 by flip-chip. Alternatively, the LED chip 20 can also be electrically connected to the first electrode 11 and the second electrode 12 by metal wires.

Figure 4:
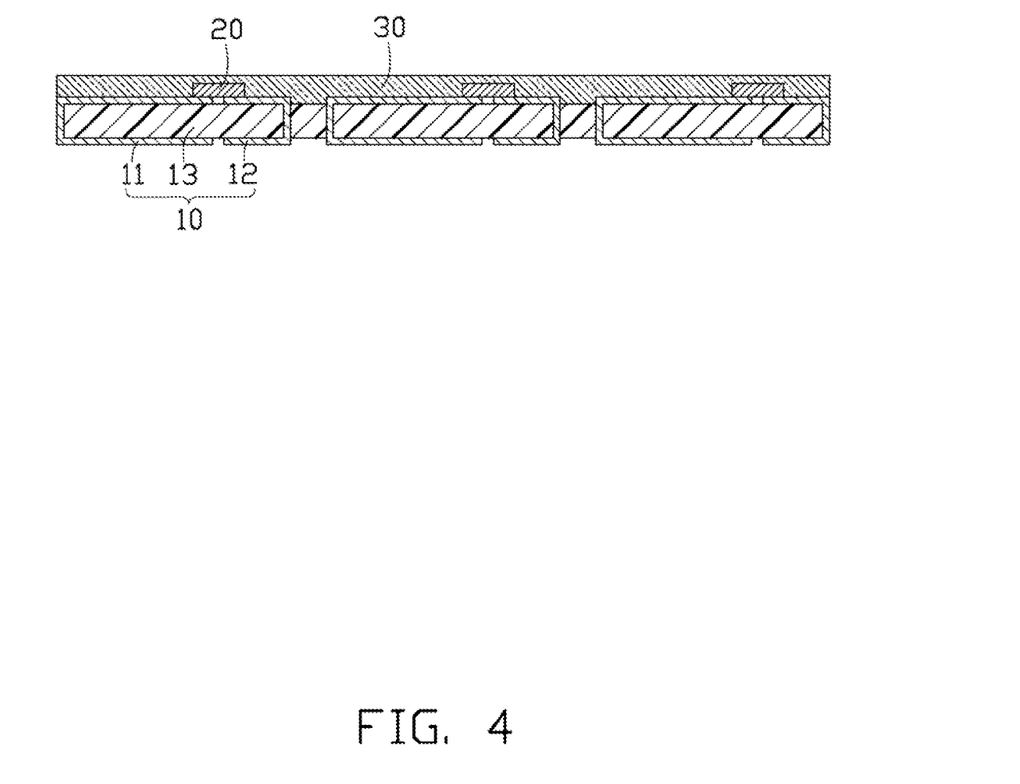

As shown in FIG. 4, an encapsulation layer 30 is provided to cover the top surface 131 of the plate 13, the first electrodes 11 and second electrodes 12 and the LED chips 20. The encapsulation layer 30 seals the LED chips 20 therein. In this embodiment, the encapsulation layer 30 is flat and made of transparent material such as transparent resin.

Figure 5:
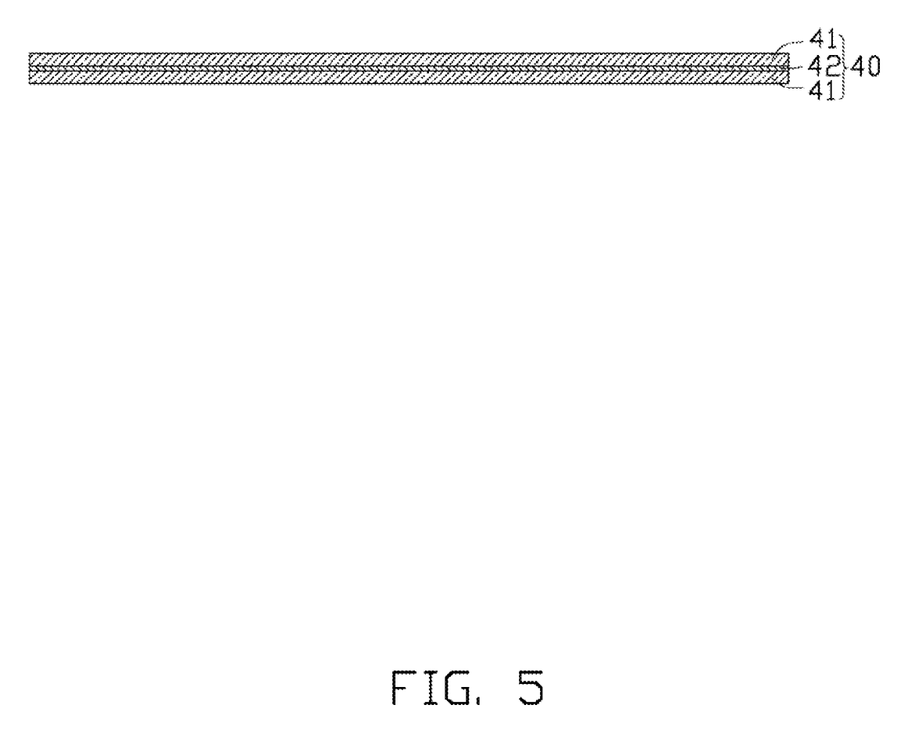

As shown in FIG. 5, a light transmission layer 40 is provided to be secured on a top surface of the encapsulation layer 30 whereby the light transmission layer 40 is located on a light output path of each LED chip 20. The light transmission layer 40 includes two parallel transparent plates 41 and a fluorescent layer 42 sandwiched therebetween. A length of the transparent plate 41 is equal to that of the fluorescent layer 42, and a thickness of the transparent plate 41 is greater than that of the fluorescent layer 42. In this embodiment, the thickness of the fluorescent layer 42 is less than 100, um. The transparent plate 41 is a transparent ceramic plate. Alternatively, the transparent plate 41 can also be made of other hard and transparent material.

Figure 6:
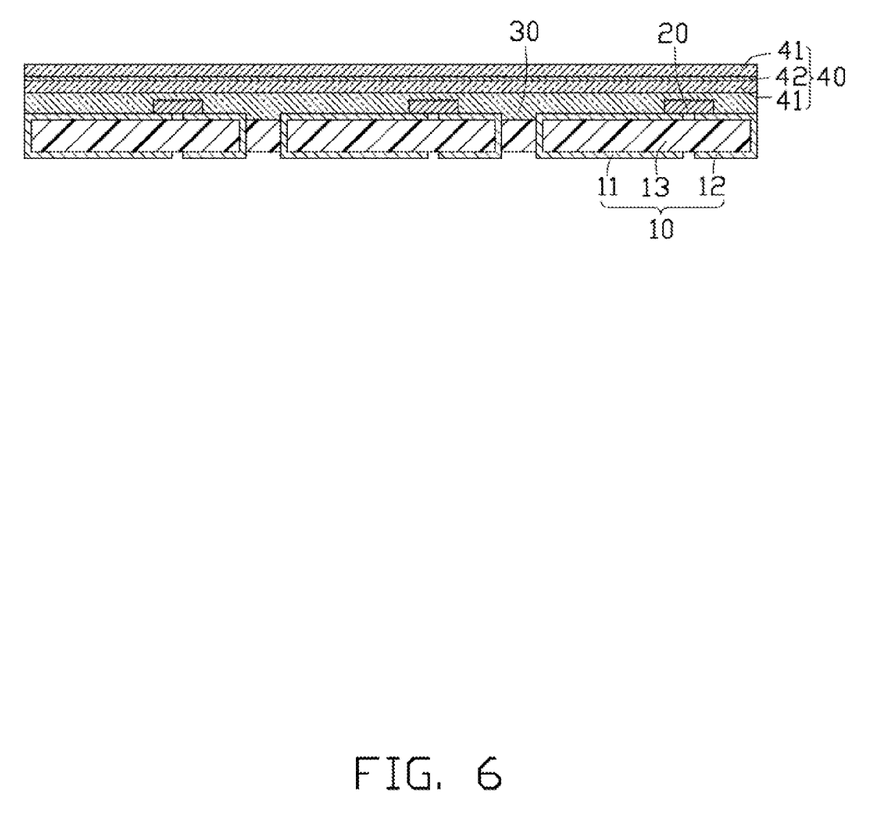

As shown in FIG. 6, the light transmission layer 40 is set on the encapsulation layer 30, and an outer periphery of the light transmission layer 40 is aligned with that of the encapsulation layer 30. A lithography may be used to form an optical pattern on a top surface of the upper transparent plate 41 to obtain a required optical effectiveness if necessary.

Figure 7:
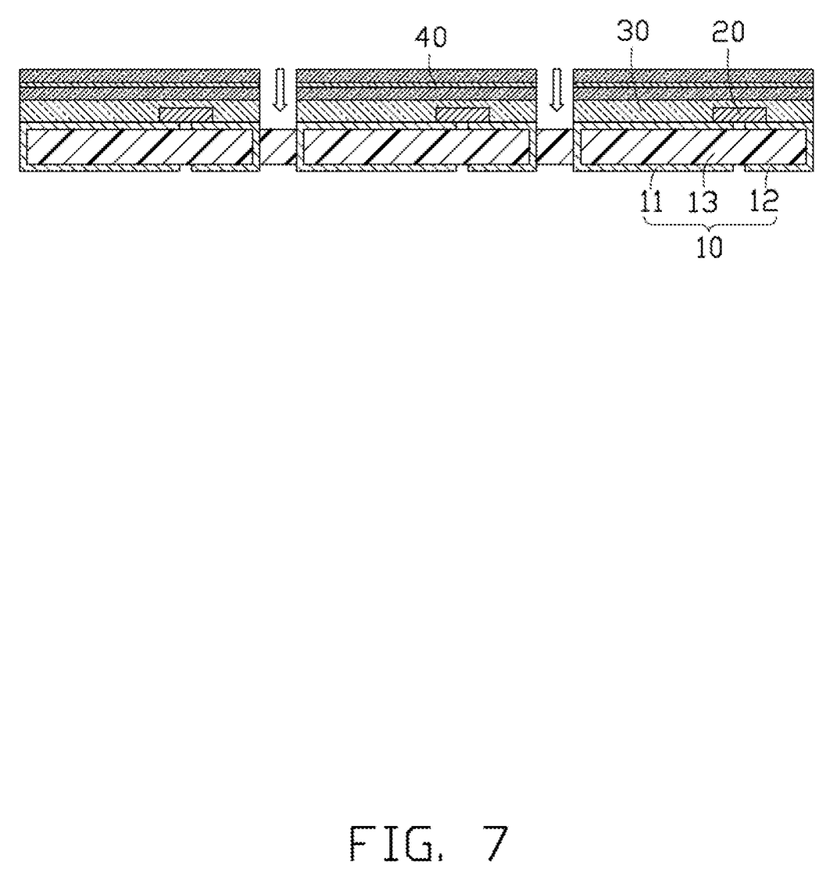

As shown in FIG. 7, the encapsulation layer 30 and the light transmission layer 40 between the adjacent LED chips 20 are processed by etching to be removed; successively the substrate 10 below the voids of the encapsulation layer 30 and light transmission layer 40 formed by the etching are cut away. Then, a plurality of separated LED packages 1 as shown in FIG. 1 are formed. Each LED package 1 includes a portion of the substrate 10 with one first electrode 11 and one second electrode 12, one LED chip 20, one encapsulation layer 30 and one light transmission layer 40.

In comparison with a conventional LED package, because the LED package 1 in accordance with the present disclosure includes the light transmission layer 40 with the two parallel transparent plates 41 and the fluorescent layer 42 sandwiched therebetween, the thickness of the fluorescent layer 42 is uniform, and the output light of the LED package 1 is uniform.

Figure 8:
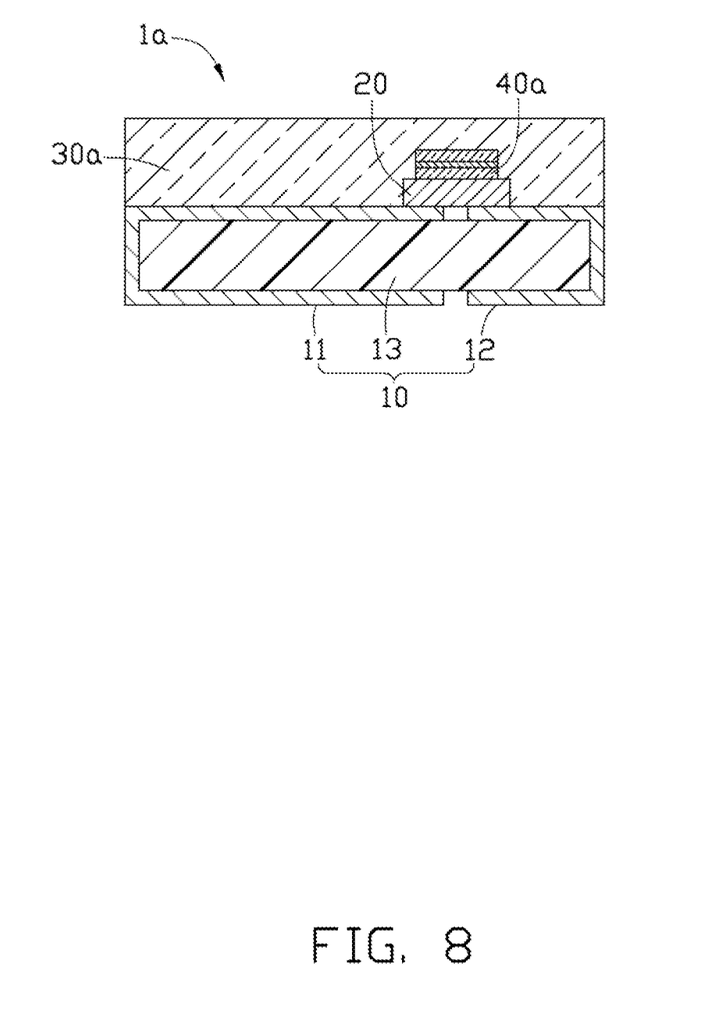
FIG. 8 is a schematic, cross-sectional view of an LED package in accordance with a second embodiment of the present disclosure.

As shown in FIG. 8, an LED package 1a according to a second embodiment is provided. Differing from the LED package 1 of the first embodiment, a light transmission layer 40a, is directly located on a top surface of the LED chip 20, and a length of the light transmission layer 40a, is less than that of the LED chip 20. An encapsulation layer 30a, is located on the first electrode 11 and the second electrode 12, and seals the LED chip 20 and the light transmission layer 40a, therein.

The LED package 1a, described above can be manufactured in following steps.

Figure 9:
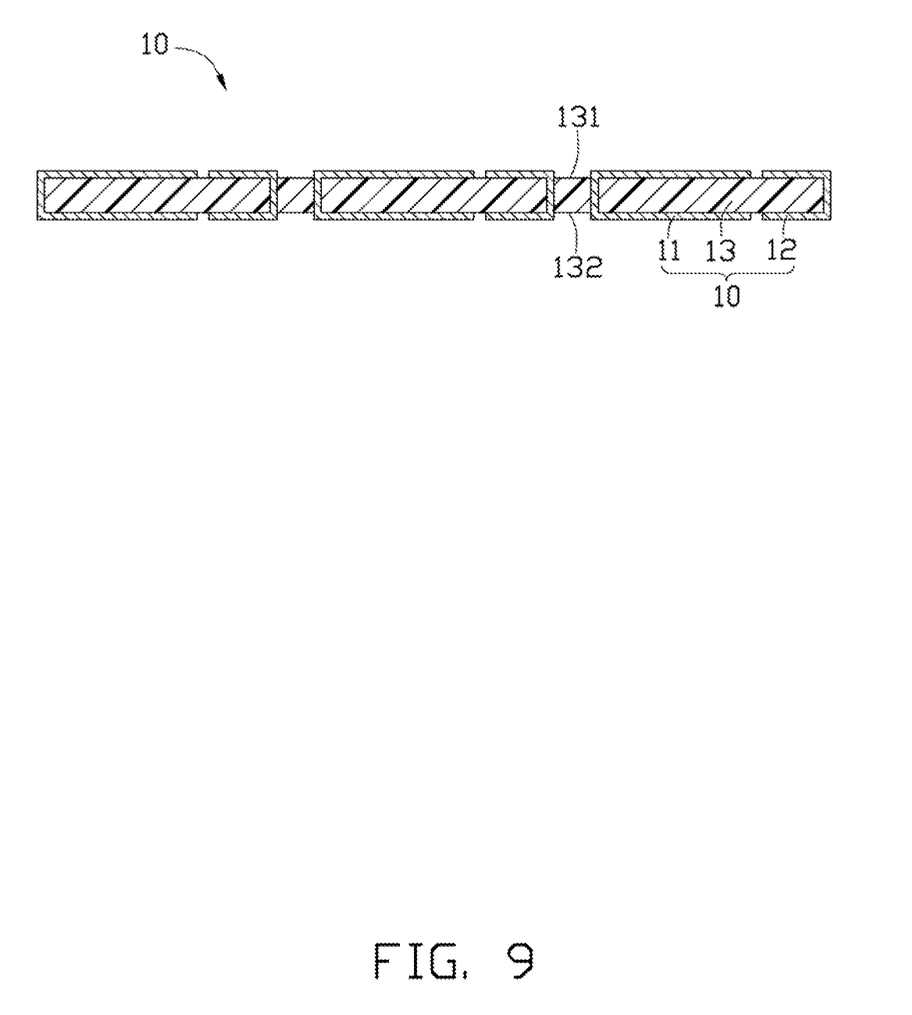
FIGS. 9-14 show steps of a method for manufacturing the LED package of FIG. 8.
Figure 10:
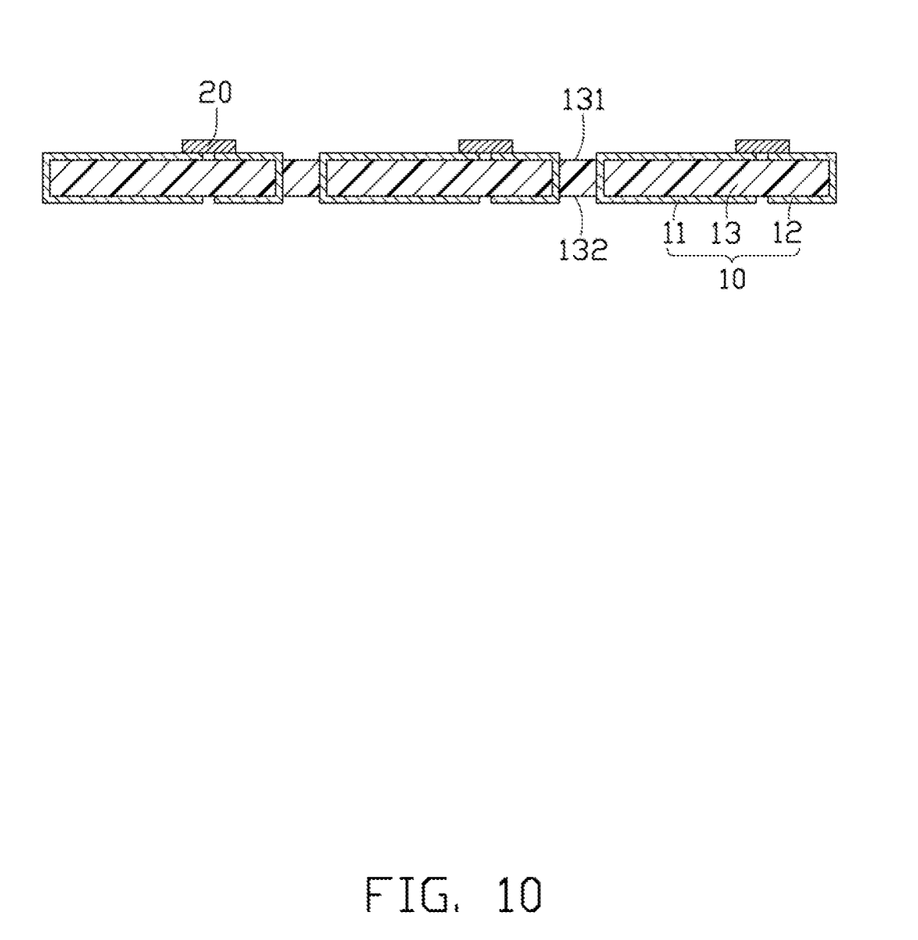

As shown in FIG. 9, an elongated substrate 10 is provided. The substrate 10 includes a plate 13 and a number of pairs of first electrodes 11 and second electrodes 12. Each of the second electrodes 12 is separated and electrically insulated from the corresponding one of the first electrodes 11, and the pairs of first electrodes 11 and second electrodes 12 are equidistantly located at different regions of the plate 13. The plate 13 is made of an electrically insulated material with high heat conductivity, such as ceramic or silicon. In this embodiment, the plate 13 is flat, and includes a top surface 131 and a bottom surface 132 opposite to the top surface 131. Each of the first electrode 11 and the second electrode 12 respectively extends from the top surface 131 and traverses downwardly through the plate 13 to reach the bottom surface 132. The first electrode 11 and the second electrode 12 are made of metallic material with high electrical conductivity, such as gold, silver, platinum, copper, aluminum, nickel, tin, magnesium or combination thereof As shown in FIG. 10, a plurality of LED chips 20 are provided on the substrate 10. Each of the LED chips 20 is electrically connected to the corresponding first electrode 11 and the corresponding second electrode 12. In this embodiment, the LED chips 20 are located over the plate 13, and each LED chip 40 is electrically connected to the corresponding first electrode 11 and the corresponding second electrode 12 by flip-chip. Alternatively embodiment, the LED chip 20 can also be electrically connected to the first electrode 11 and the second electrode 12 by metal wires.

Figure 11:
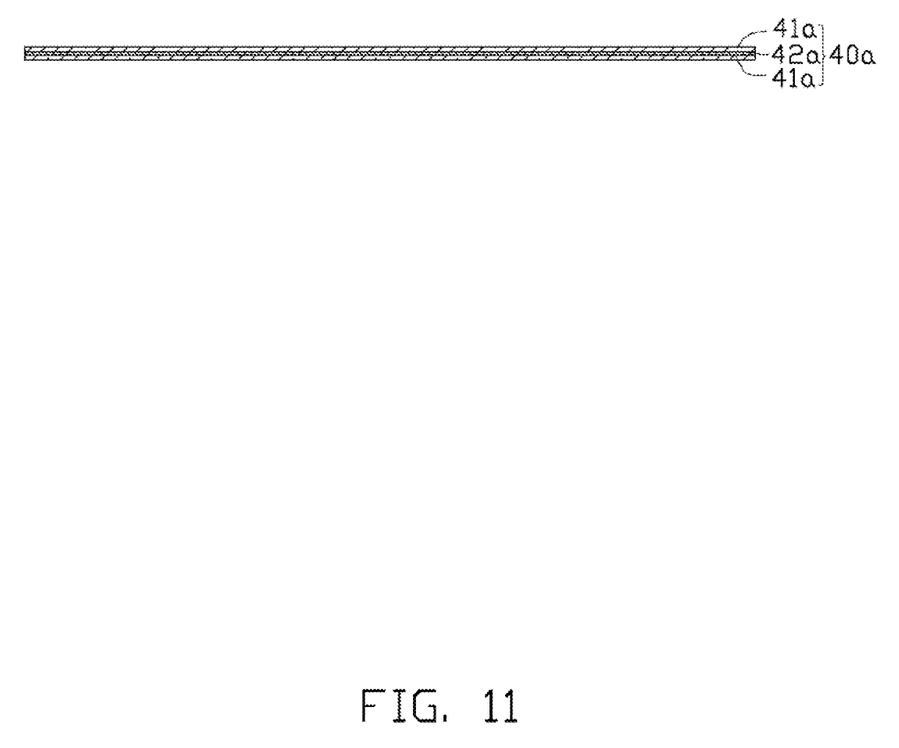

As shown in FIG. 11, a light transmission layer 40a, is provided. The light transmission layer 40a, includes two parallel transparent plates 41 a and a fluorescent layer 42a, sandwiched therebetween. A length of the transparent plate 41a, is equal to that of the fluorescent layer 42a,, and a thickness of the transparent plate 41 a is greater than that of the fluorescent layer 42a. In this embodiment, the thickness of the fluorescent layer 42 is less than 100, um. The transparent plate 41 is a transparent ceramic plate. Alternatively, the transparent plate 41 can be made of other hard and transparent material.

Figure 12:
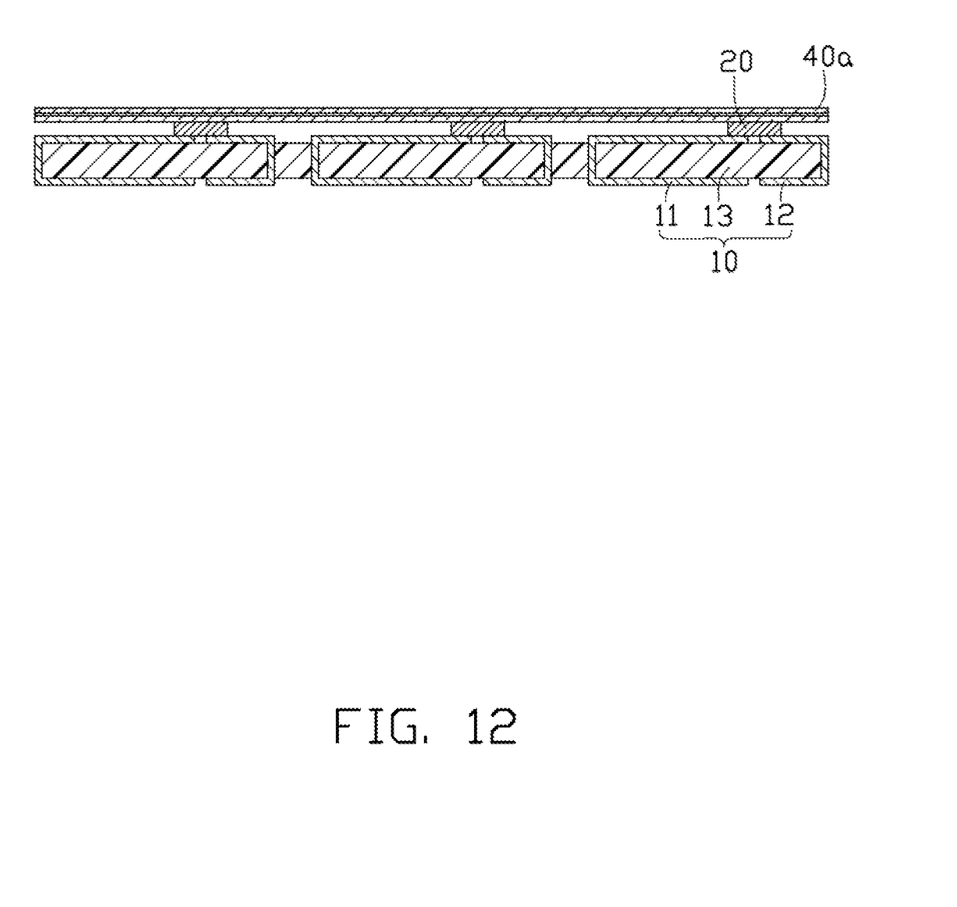

As shown in FIG. 12, the light transmission layer 40a, is directly arranged on the LED chips 20 whereby the light transmission layer 40a, covers a light output path of each LED chip 20.

Figure 13:
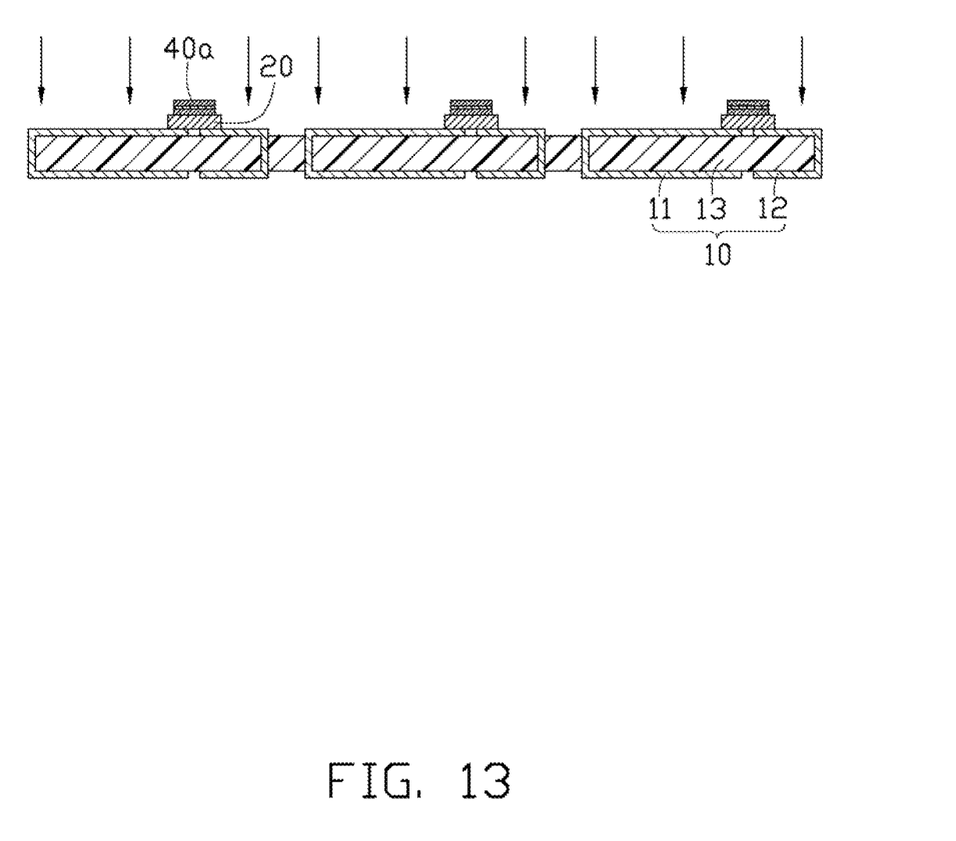

As shown in FIG. 13, the light transmission layer 40a, is formed on each LED chip 20 and spaced from each other by etching.

Figure 14:
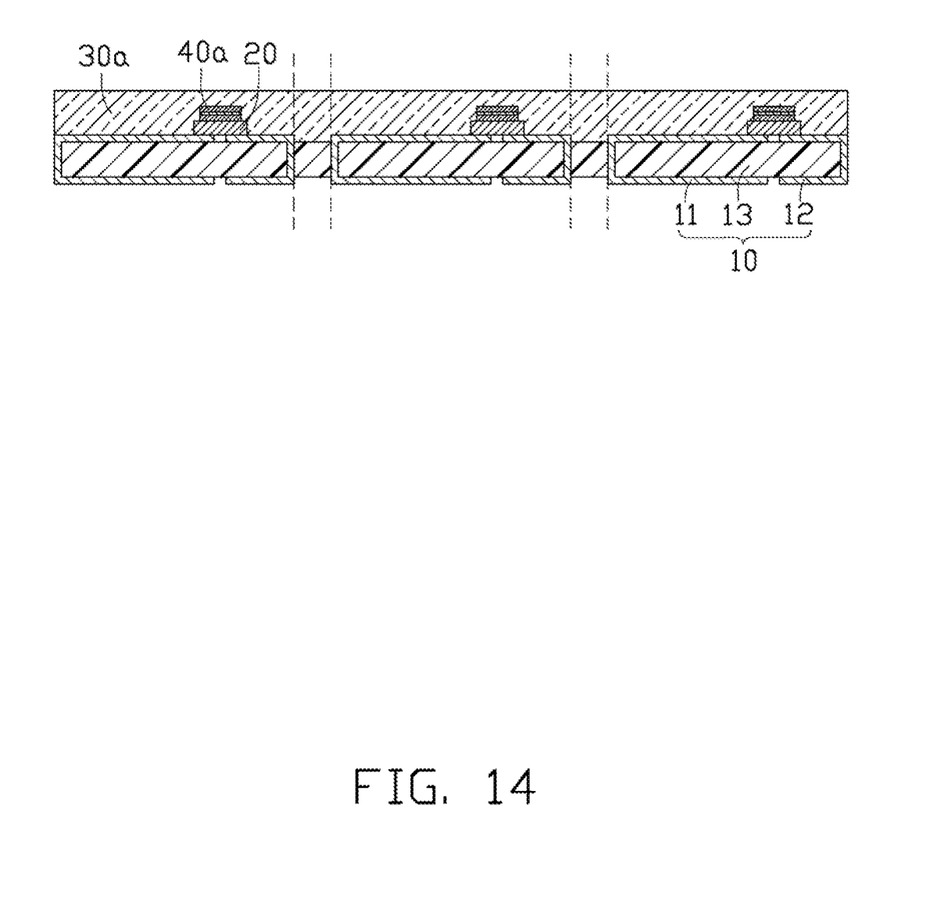

As shown in FIG. 14, an encapsulation layer 30a, is provided to cover the top surface of the substrate 10 and seals the LED chips 20 and the light transmission layer 40a, therein. In this embodiment, the encapsulation layer 30a, is flat, and a length of the encapsulation layer 30a, is equal to that of the substrate 10. Then, the encapsulation layer 30a, and the substrate 10 are cut into a plurality of separated LED packages la as shown in FIG. 8. Each of the LED packages la includes a portion of the substrate 10 with one first electrode 11 and one second electrode 12, one LED chip 20, one encapsulation layer 30a, and one light transmission layer 40a.

In comparison with a conventional LED package, due to that the LED package 1a, in accordance with the present disclosure includes the light transmission layer 40 with the two parallel transparent plates 41 a and the fluorescent layer 42a, sandwiched therebetween, the thickness of the fluorescent layer 42a, is thereby kept uniform, and the output light of the LED package 1a, is uniform.

Particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An LED (light emitting diode) package, comprising:
a substrate comprising a first electrode, and a second electrode separated and electrically insulated from the first electrode;
an LED chip arranged on the substrate, the LED chip being electrically connected to the first electrode and the second electrode of the substrate;
an encapsulation layer is formed on the substrate to seal the LED chips therein; and
a light transmission layer arranged on a light output path of the LED chip, the light transmission layer comprising two parallel transparent plates and a fluorescent layer sandwiched between the two transparent plates;
wherein the light transmission layer is directly located on a top surface of each LED chip, and the encapsulation layer also seals the light transmission layer therein.

2. The LED package of claim 1, wherein the substrate comprises a plate which supports the first electrode and the second electrode, and the plate is made of an electrically insulated and thermally conductive material.

3. The LED package of claim 1, wherein a thickness of each of the transparent plates is greater than that of the fluorescent layer.

4. The LED package of claim 1, wherein a thickness of the fluorescent layer is less than 100, um.

5. The LED package of claim 1, wherein each of the transparent plates is a transparent ceramic plate.

6. The LED package of claim 1, wherein a length of the light transmission layer is less than that of the encapsulation layer.

7. The LED package of claim 6, wherein a length of the light transmission layer is less than that of the LED chip.

8. The LED package of claim 7, wherein a length of the transparent plate is equal to that of the fluorescent layer.

9. The LED package of claim 1, wherein the encapsulation layer is transparent.

10. The LED package of claim 9, wherein the encapsulation layer is made of transparent resin.

* * * * *